United States Patent
Nagai

(10) Patent No.: US 7,821,842 B2
(45) Date of Patent: Oct. 26, 2010

(54) SYNCHRONOUS MEMORY DEVICES AND CONTROL METHODS FOR PERFORMING BURST WRITE OPERATIONS

(75) Inventor: Kenji Nagai, Gifu-Ken (JP)

(73) Assignee: Spansion LLC, Sunnyvale, CA (US)

( * ) Notice: Subject to any disclaimer, the term of this patent is extended or adjusted under 35 U.S.C. 154(b) by 185 days.

(21) Appl. No.: 12/176,997

(22) Filed: Jul. 21, 2008

(65) Prior Publication Data
US 2009/0207672 A1    Aug. 20, 2009

(30) Foreign Application Priority Data
Jul. 19, 2007    (JP) .............................. 2007-187763

(51) Int. Cl.
*G11C 7/10*    (2006.01)
(52) U.S. Cl. ........................... 365/189.011; 365/189.16
(58) Field of Classification Search .......... 365/189.011, 365/189.16, 189.05
See application file for complete search history.

(56) References Cited

U.S. PATENT DOCUMENTS

| | | | |
|---|---|---|---|
| 5,748,560 A * | 5/1998 | Sawada | ................ 365/230.03 |
| 6,295,245 B1 | 9/2001 | Tomita et al. | |
| 2002/0067655 A1 | 6/2002 | Pascucci | |
| 2003/0156489 A1 * | 8/2003 | Takeuchi et al. | ............ 365/233 |
| 2005/0265088 A1 | 12/2005 | Ishizaki | |

FOREIGN PATENT DOCUMENTS

| | | |
|---|---|---|
| JP | 07254278 | 10/1995 |
| JP | 2004212749 | 7/2004 |
| JP | 2004355801 | 12/2004 |

* cited by examiner

*Primary Examiner*—Vu A Le

(57) ABSTRACT

Synchronous memory devices and control methods for performing burst write operations are disclosed. In one embodiment, a synchronous memory device for controlling a burst write operation comprises a first buffer circuit for buffering a first control signal requesting an exit from the burst write operation in synchronization with a clock signal associated with the burst write operation, and a latch circuit for performing a reset in response to the first control signal forwarded by the first buffer circuit, wherein the reset triggers the exit from the burst write operation.

17 Claims, 7 Drawing Sheets

FIG. 2

| OPERATION | CE# | WE# | CLK |
|---|---|---|---|
| ENTER BURST WRITE OPERATION | L | L | ↑ |
| CONTINUE BURST WRITE OPERATION | L | X | ↑ |
| EXIT BURST WRITE OPERATION | H | X | ↑ |

FIG. 6

| OPERATION | CE# | WE# | CLK |
|---|---|---|---|
| ENTER BURST WRITE OPERATION | L | L | ↑ |
| CONTINUE BURST WRITE OPERATION | L | X | ↑ |
| EXIT BURST WRITE OPERATION (1) | H | X | ↑ |

| EXIT BURST WRITE OPERATION (2) | X | H | ↑ |
|---|---|---|---|

SYNCHRONOUS MEMORY DEVICES AND CONTROL METHODS FOR PERFORMING BURST WRITE OPERATIONS

CLAIM OF PRIORITY

This application claims priority from Japanese patent application 2007-187763 filed on Jul. 19, 2007.

FIELD OF TECHNOLOGY

The present invention relates to semiconductor devices and methods, particularly to synchronous memory devices and control methods for performing burst mode operations.

BACKGROUND

A burst mode operation enables a high-speed synchronous read and/or write operation in a memory device. The burst mode operation involves a multi clock sequence performed in an ordered fashion. The start operation and continue operation with respect to the burst write operation in a synchronous memory device are performed in synchronization with a clock signal or sync signal. On the other hand, an exit operation from the burst write operation is controlled by an asynchronous signal. For instance, in a flash memory, the exit operation is initiated by an asynchronous transition of a chip enable signal from a low level to a high level. However, when the exit operation from the burst write operation is performed asynchronously at the last cycle of the burst write operation, there is a risk that the last cycle of the write operation may be terminated prematurely. To prevent the overlapping of the last cycle of the burst write operation with the exit operation, a control signal requesting an exit from the burst write operation needs to be inhibited for a fixed time interval until the burst write operation is fully completed.

However, if the cycle of the sync signal at a higher frequency is longer than the hold time, there may be cases where a wait time period or a wait cycle must be provided during the period from exiting the burst write operation until moving into the next operation cycle. Implementing a fix for the cases makes the control of the burst mode operation more complex.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One embodiment of the present invention is directed to a synchronous memory device for controlling a burst write operation which comprises a first buffer circuit for buffering a first control signal requesting an exit from the burst write operation in synchronization with a clock signal associated with the burst write operation, and a latch circuit for performing a reset in response to the first control signal forwarded by the first buffer circuit, wherein the reset triggers the exit from the burst write operation.

Another embodiment of the present invention is directed to a synchronous memory device for controlling a burst write operation which comprises a first flip flop circuit for buffering an enter command for the burst write operation in synchronization with a clock signal associated with the burst operation, and a second flip flop circuit for buffering an exit command for the burst write operation in synchronization with the clock signal. The device further comprises a reset decoder for decoding the exit command forwarded by the second flip flop circuit, and a latch circuit for performing a reset in response to the exit command forwarded by the reset decoder.

Yet another embodiment of the present invention is directed to a synchronous memory device for controlling a burst write operation which comprises a first logic circuit and a second logic circuit for generating a set trigger signal and a reset trigger signal, respectively, by performing a logical operation between a chip enable signal and a write enable signal associated with the burst write operation. The device further comprises a first flip flop circuit for buffering the reset trigger signal of the second logic circuit in synchronization with a clock signal associated with the burst write operation, and a second flip flop circuit for buffering the set trigger signal of the first logic circuit in synchronization with the clock signal.

As will be illustrated in the detailed description, other embodiments pertain to control systems, methods, and devices for synchronous memory devices which are capable of performing an exit operation from a burst write operation in sync with a clock signal associated with the burst write operation. This enables the operations of the exit operation as well as other burst mode operations, such as a start operation, a continue operation, and so on, to be in sync with each other. Thus, the burst write operation can be completed without being cut short by the exit operation since a command for triggering the exit operation is processed in synchronization with the clock signal. Accordingly, the feature eliminates a need for inhibiting the exit operation until the last cycle of the burst write operation is completed using a complex control scheme as recited by the conventional art.

BRIEF DESCRIPTION OF THE DRAWINGS

Example embodiments are illustrated by way of example and not limitation in the figures of the accompanying drawings, in which like references indicate similar elements and in which:

FIG. 2 is a diagram showing states of input signals requesting operation associated with the burst write operation of FIG. 1, according to one embodiment.

FIG. 6 is a diagram showing states of input signals requesting operation associated with the burst write operation of FIG. 5, according to one embodiment.

Figure 1:
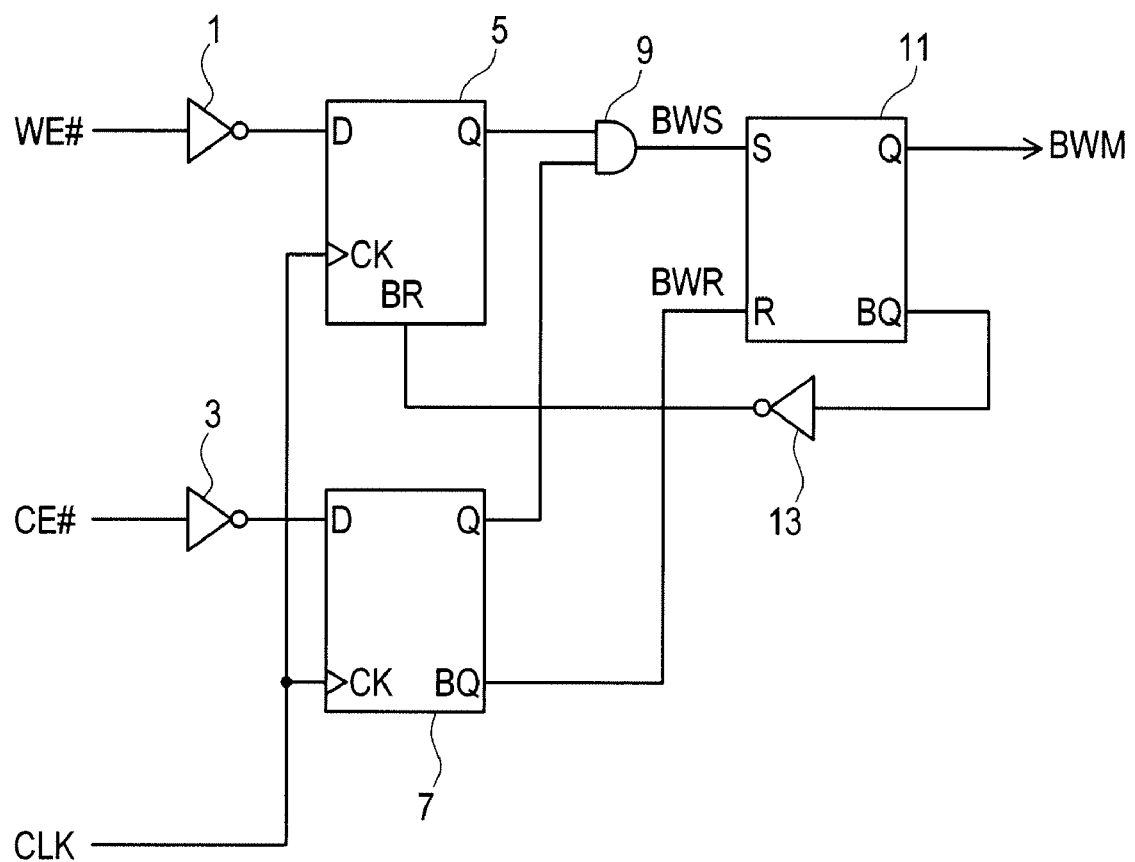
FIG. 1 is a circuit diagram of an exemplary synchronous memory device for controlling a burst write operation, according to one embodiment.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments pertain to control systems, methods, and devices for synchronous memory devices which are capable of performing an exit operation from a burst write operation in sync with a clock signal associated with the burst write operation. This enables the operations of the exit operation as well as other operations, such as a start operation, a continue operation, and so on, associated with the burst write operation to be in sync with each other. Thus, the burst write operation can be completed without being cut short by the exit operation since a command for triggering the exit operation is processed in synchronization with the clock signal. Accordingly, the feature eliminates a need for inhibiting the exit operation until the last cycle of the burst write operation is completed using a complex control scheme as recited by the conventional art.

FIG. 1 is a circuit diagram of an exemplary synchronous memory device for controlling a burst write operation, according to one embodiment. In one exemplary implementation, a burst write operation is requested by a first control signal (e.g., a chip enable single CE#) and a second control signal (e.g., a write enable signal WE#). The write enable signal WE# and the chip enable signal CE# are processed through an inverter gate 1 and an inverter gate 3, respectively. Output terminals of the inverter gates 1 and 3 are connected to input terminals (D) of a first buffer circuit (e.g., D-type flip-flop 5) and a second buffer circuit (e.g., D-type flip-flop 7). Synchronizing terminals (CK) of D-type flip-flops 5 and 7 are supplied with a clock signal CLK. Output terminals (Q) of the D-type flip-flops 5 and 7 are connected to an input terminal of a logic circuit (e.g., AND gate 9). The output terminal of the AND gate 9 is connected to a set terminal (S) of a latch circuit 11. An inverted output terminal (BQ) of the D-type flip-flop 7 is connected to a reset terminal (R) of the latch circuit 11. The inverted output terminal (BQ) of the latch circuit 11 is connected to the reset terminal (BR) of the D-type flip-flop 5 through an inverter gate 13. A set signal BWS is output from the AND gate 9, and a reset signal BWR is output from the inverted output terminal (BQ) of the D-type flip-flop 7. A burst write mode signal BWM indicative of the burst write operation state is output from the output terminal (Q) of the latch circuit 11.

FIG. 2 is a diagram showing states of input signals requesting operation associated with the burst write operation of FIG. 1, according to one embodiment. With respect to FIG. 1, the operation to enter the burst write operation is requested if the chip enable signal CE# and the write enable signal WE# are both at a low level (L), and the clock signal CLK is on the rising edge. The operation to continue the burst write operation is requested if the chip enable signal CE# is at a low level (L), and the clock signal CLK is on the rising edge. In this case, the logic level of the write enable signal WE# may be left unspecified (X). The operation to exit the burst write operation is requested if the chip enable signal CE# is at a high level (H), and the clock signal CLK is on the rising edge. In this case, the logic level of the write enable signal WE# may be left unspecified (X). Any of the enter burst write operation, continue burst write operation and exit burst write operation is performed by buffering the logic level of the chip enable signal CE# and write enable signal WE# at the time of the rising edge of the clock signal CLK. The three operations are requested in synchronization with the clock signal CLK.

Figure 3:
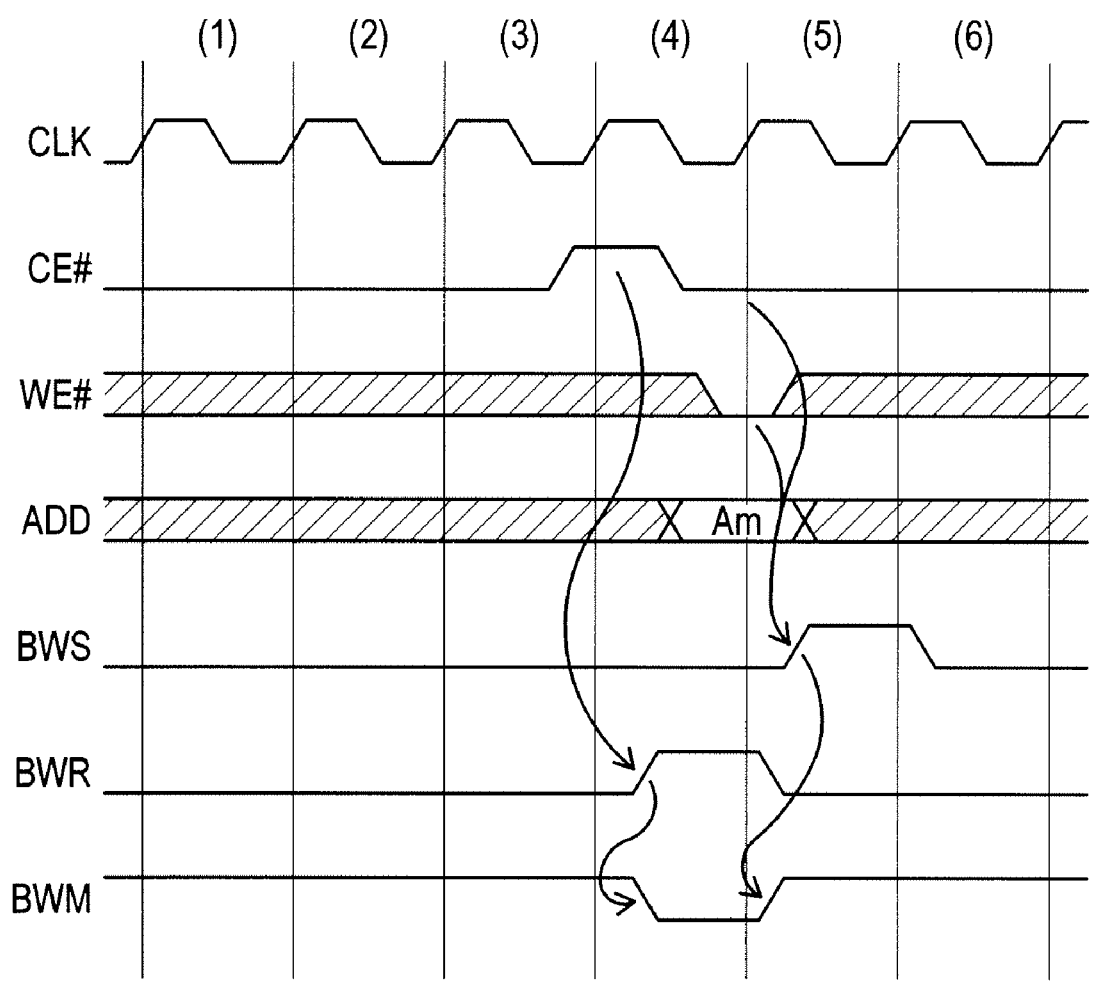
FIG. 3 is an operation waveform diagram associated with the burst write operation of FIG. 1, according to one embodiment.

FIG. 3 is an operation waveform diagram associated with the burst write operation of FIG. 1, according to one embodiment. In FIG. 3, clock cycles (1) through (4) represent the duration of a first burst write operation, and clock cycles (5) and (6) represent the duration of a second burst write operation. The first burst write operation includes the cycles in which the burst operation is in progress (e.g., clock cycles (1) through (3)), and the following cycle of exiting the burst write operation (e.g., clock cycle (4)). The second burst write operation includes the cycle of entering the burst write operation (e.g., clock cycle (5)), and the following cycle in which the burst write operation is in progress (e.g., clock cycle (6)). FIG. 3 is an operation waveform diagram in case of an immediate shift from the first burst write operation to the second burst write operation.

In FIG. 1, the D-type flip-flops 5 and 7 buffer an inverted signal of the chip enable signal CE# and an inverted signal of the write enable signal WE# in synchronization with the clock signal CLK. The buffered signals are subjected to the logical operation AND by the AND gate 9. If the chip enable signal CE# and the write enable signal WE# are both at a low level, a high level set signal BWS is output from the AND gate 9 which performs the logical operation AND on the inverted signals of the afore-mentioned signals. The latch circuit 11 is set by the high level set signal BWS, thereby setting the burst write mode signal BWM to a high level. With this provision, the operation to enter the burst write operation is accepted. In FIG. 2, this is shown by the enter command to the burst write operation. The default address Am is input at this time as well. In FIG. 3 this is shown by clock cycle (5).

Upon entering the burst write operation and setting the burst write mode signal BWM, a low level signal is output from the inverted output terminal (BQ) of the latch circuit 11. This signal is inverted by the inverter gate 13 into a high level signal, and is input to the reset terminal of the D-type flip flop 5. The D-type flip flop 5 is thereby reset, and the output terminal (Q) is held at a low level, regardless of the logic level of the write enable signal WE#. With this, the set signal BWS is held at a low level. Accordingly, no set signals BWS are issued with respect to the latch circuit 11 after entering the burst write operation. In other words, the burst write mode signal BWM which was already set once is reset only by a reset signal BWR.

The write operation continues after the next cycle (6), provided the low level chip enable signal CE# is buffered in synchronization with an edge of the clock signal CLK of transition to a high level. The address corresponding to the memory cell which is written to serves as the address which is incremented in each clock cycle, from the default address Am, by a controller which is not illustrated.

The burst write operation continues in clock cycles (1) through (3) as well, in a similar manner. The low level chip enable signal CE# is buffered in synchronization with an edge of the clock signal CLK of transition to a high level, thereby allowing the write operation to continue. Clock cycles (6) and (1) through (3) include commands to continue the burst write operation, as shown in FIG. 2.

The chip enable signal CE# is set to a high level prior to clock cycle (4). The high level chip enable signal CE# is inverted by the inverter gate 3 so as to be buffered in the D-type flip flop 7 in synchronization with the transition of the clock signal CLK to a high level. The buffered chip enable signal CE# is output by the inverted output terminal (BQ), as a high level reset signal BWR. The latch circuit 11 is reset by the high level reset signal BWR, thereby resetting the burst write mode signal BWM to a low level. With this provision, the operation to exit the burst write operation is accepted. In FIG. 2, this is shown by the exit command from the burst write operation.

The set signal BWS in response to the command to enter the burst write operation and the reset signal BWR in response to the command to exit the burst write operation are generated with respect to the latch circuit 11. The latch circuit 11 latches the state of the burst write operation and outputs the burst write mode signal BWM based on the chip enable signal CE# and the write enable signal WE# which are both buffered in synchronization with the transition of the clock signal CLK to a high level. Any of the enter command, continue command and exit command with respect to the burst write operation is input as a clock signal-synchronized command. This eliminates the need for specific controls, such as separate adjustment of the mutual relationships between commands, and adjustments of timings (e.g., adjustment of input timing), thereby making overall control of command input easier.

In one embodiment, a computer executable method for controlling a burst write operation in a synchronous memory device comprises latching a state for performing the burst write operation, buffering a first control signal for requesting exit from the burst write operation in synchronization with a clock signal associated with the burst write operation, and resetting the state for the performing the burst write operation in response to the buffering of the first control signal, where the first control signal is associated with a chip disable signal.

Figure 4:
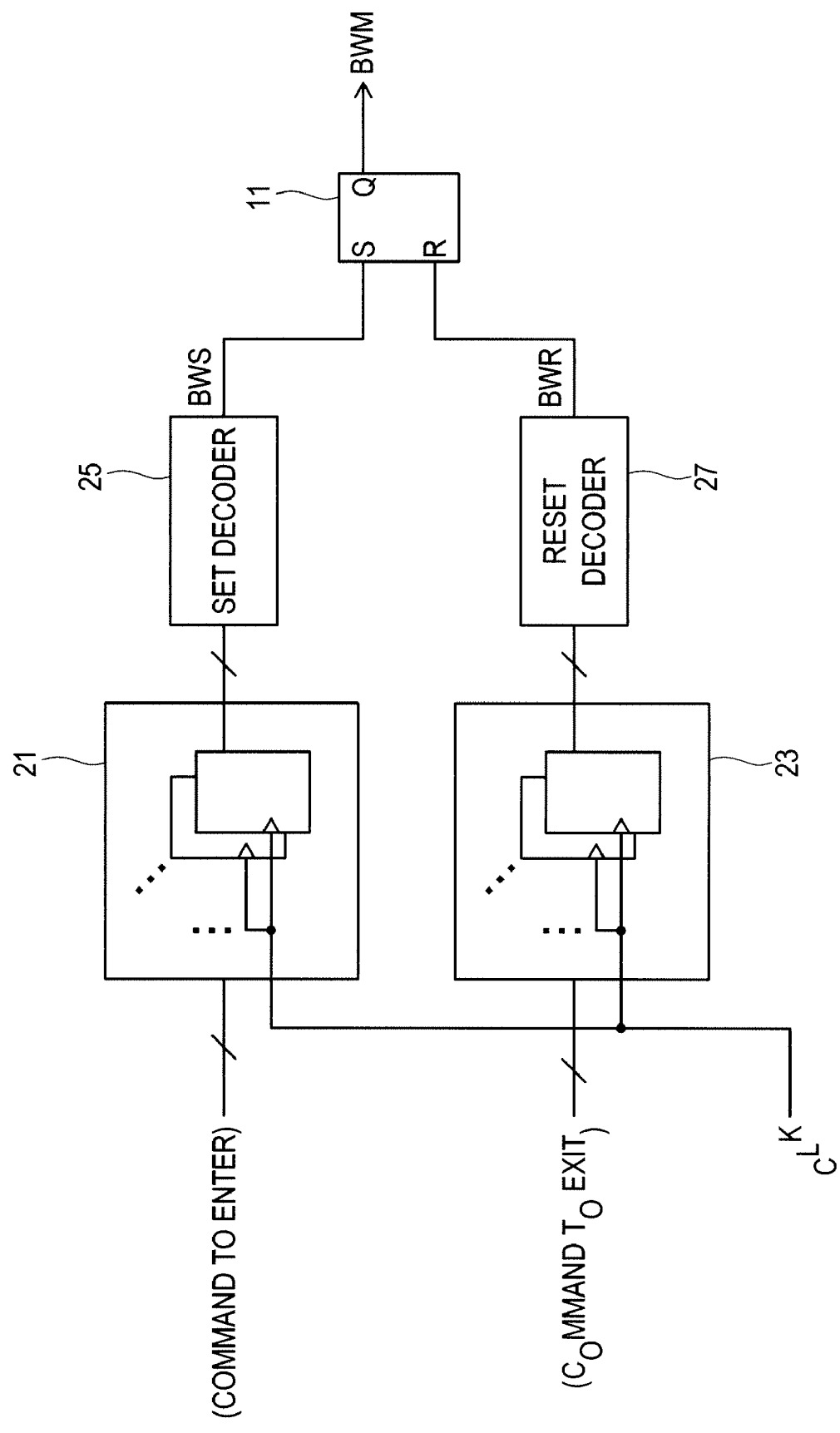
FIG. 4 is a circuit diagram of an exemplary synchronous memory device for controlling a burst write operation, according to one embodiment.

FIG. 4 is a circuit diagram of an exemplary synchronous memory device for controlling a burst write operation, according to one embodiment. FIG. 4 describes a case where both the enter command and the exit command are set in response to a combination of a plurality of control signals. In this embodiment, the respective control signals are sent to D-type flip flop groups 21 and 23. The D-type flip flop groups 21 and 23 have a structure comprising a D-type flip flop for each control signal, and they buffer each control signal in synchronization with the transition of the clock signal CLK to a high level. The control signal buffered in the D-type flip flop group 21 in response to the enter command is input to a set decoder 25 for decoding. The control signal buffered in the D-type flip flop group 23 in response to the exit command is input to a reset decoder 27 for decoding. A set signal BWS and a reset signal BWR are respectively output from the set decoder 25 and reset decoder 27 to set/reset the latch circuit 11.

Also, even in the case that the enter command and exit command with respect to the burst write operation are input in response to a combination of a plurality of control signals, if each of the control signals is buffered in synchronization with the clock signal CLK, and the buffered control signals are decoded, it is possible to obtain clock signal CLK-synchronized operations in response to any of the enter command, continue command and exit command.

Figure 5:
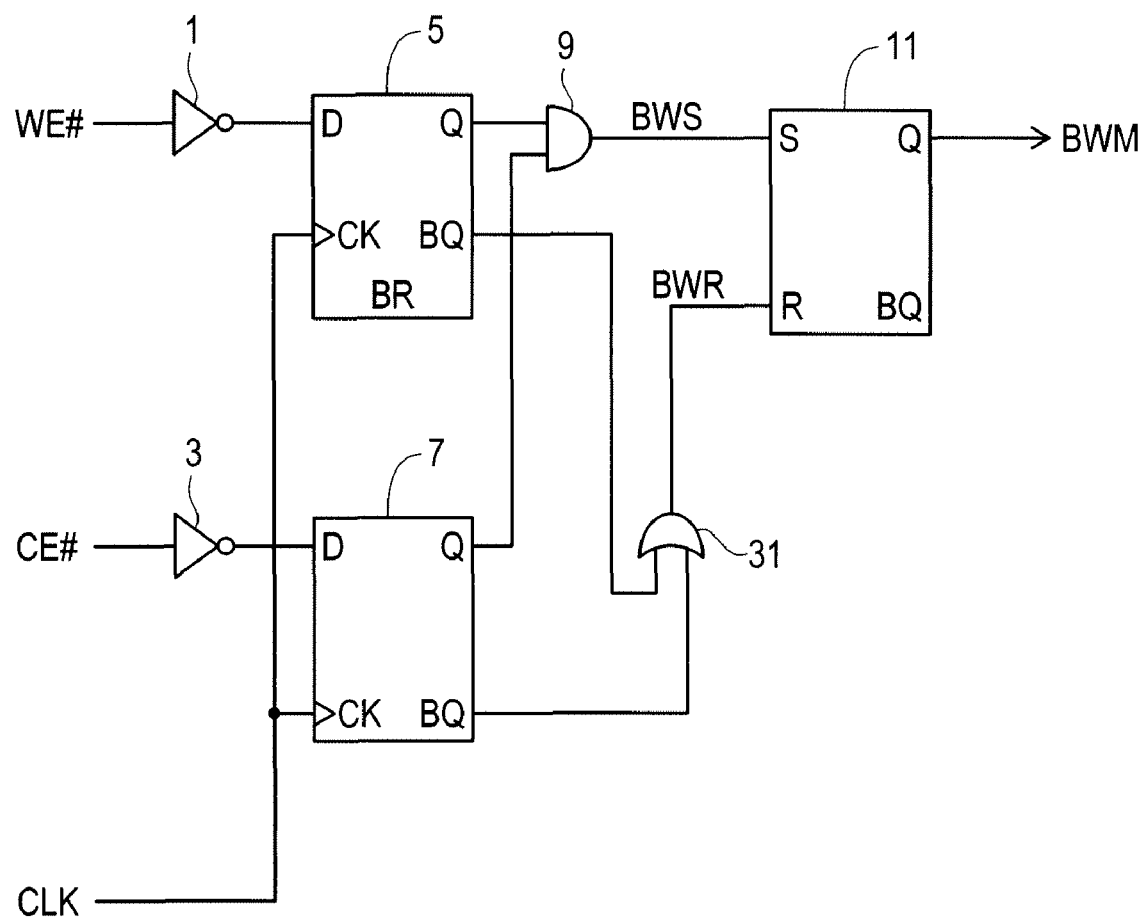
FIG. 5 is a circuit diagram of an exemplary synchronous memory device for controlling a burst write operation, according to one embodiment.

FIG. 5 is a circuit diagram of an exemplary synchronous memory device for controlling a burst write operation, according to one embodiment. In FIG. 5, control signals for setting the exit command are respectively sent to the D-type flip flops 5 and 7. The inverted output terminals (BQ) of the D-type flip flops 5 and 7 are input to an OR circuit 31, and the output of the OR circuit 31 is input to the reset terminal (R) of the latch circuit 11. The reset signal BWR is generated in response to a high level of either one of the chip enable signal CE# or the write enable signal WE# on the rising edge of the clock signal CLK. The latch circuit 11 is reset in response to the high level reset signal BWR, thereby resetting the burst write mode signal BWM to a low level. With this provision, the operation to exit the burst write operation is accepted. In FIG. 6, this is shown by the exit command 1 or 2 with respect to the burst write operation.

In one embodiment, the respective control signals which are latched in the D-type flip flops 5 and 7 in response to the clock signal CLK are subjected to logical operations in the logic circuits 9 and 31. The resulting output signals are input to the latch circuit 11, thereby making it possible to set/hold the configuration with the clock signal CLK, so as to accommodate high frequencies.

Figure 7:
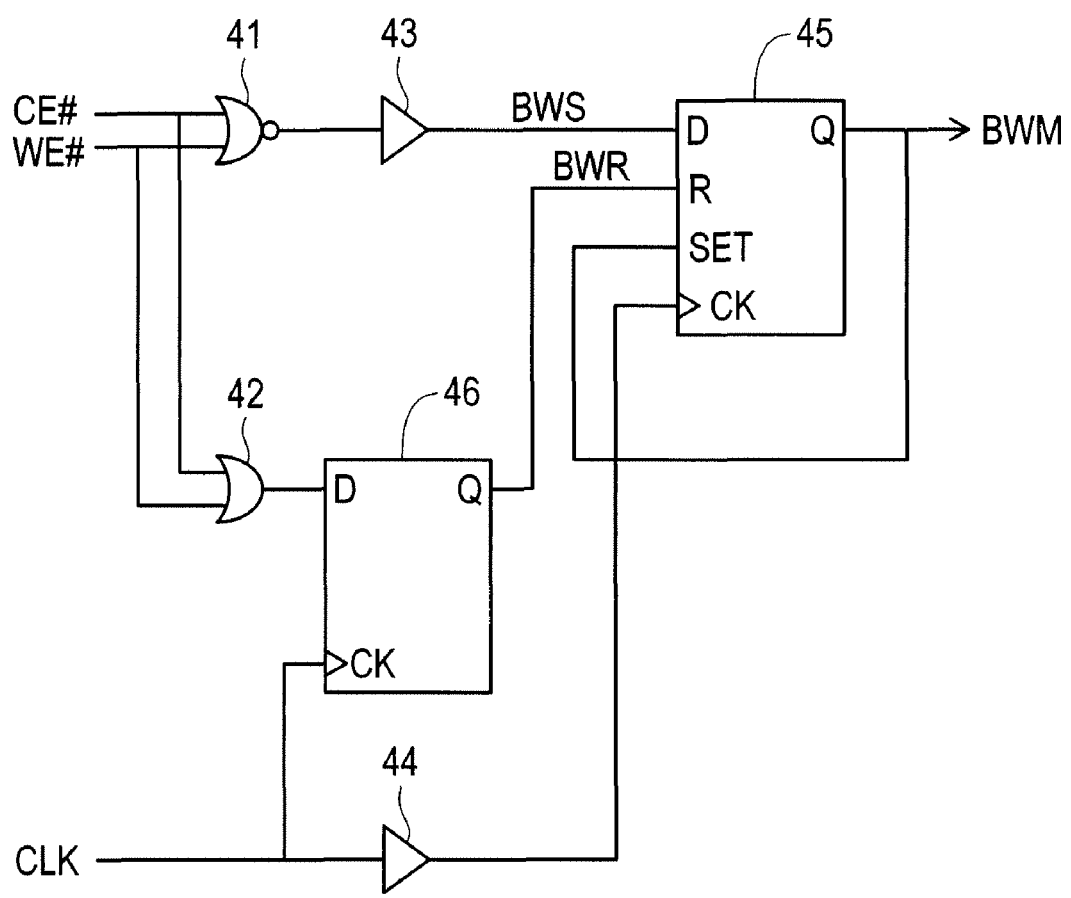
FIG. 7 is a circuit diagram of an exemplary synchronous memory device for controlling a burst write operation, according to one embodiment.

FIG. 7 is a circuit diagram of an exemplary synchronous memory device for controlling a burst write operation, according to one embodiment. In FIG. 7, the burst write operation is requested by the chip enable signal CE# and the write enable signal WE#, and further, exit from the burst write operation is requested by either one of the two control signals. The write enable signal WE# and the chip enable signal CE# forwarded to the synchronous memory device (not illustrated) are respectively input to the logic circuits 41 and 42. The output terminal of the logic circuit 42 is connected to the input terminal (D) of the D-type flip flop 46. The output terminal of the logic circuit 41 is input to a delay circuit 43 corresponding to the amount of delay by the D-type flip flop 46, and the output BWS of the delay circuit 43 is connected to the input terminal (D) of a set terminal-equipped D-type flip flop 45. The synchronizing terminal (CK) of the D-type flip flop 46 is supplied with a clock signal CLK. The synchronizing terminal (CK) of the set terminal-equipped D-type flip flop 45 is supplied with the clock signal CLK through a delay circuit 44 corresponding to the amount of delay by the D-type flip flop 46. The output terminal (Q) of the D-type flip flop 46 is connected to the reset terminal (R) of the set terminal-equipped D-type flip flop 45. The output terminal (Q) of the set terminal-equipped-D-type flip flop 45 is connected to the set terminal (SET) of the set terminal-equipped D-type flip flop 45.

In FIG. 7, the set terminal-equipped D-type flip flop 45 buffers the signal BWS resulting from the logical operation between the chip enable signal CE# and the write enable signal WE#, in synchronization with the clock signal CLK. The buffered signal BWS is simultaneously an output to the output terminal BWM of the set terminal-equipped D-type flip flop 45, and an input to the set terminal (SET). If the chip enable signal CE# and the write enable signal WE# are both at low level, the burst write mode signal BWM is set to a high level so that the burst write mode signal BWM is held at a high level, regardless of the information on the input terminal (D) from the set terminal (SET). The D-type flip flop 46 buffers the signal resulting from the logical operation between the chip enable signal CE# or the write enable signal WE# in synchronization with the clock signal CLK. The reset signal BWR to be output is input to the reset terminal of the set terminal-equipped D-type flip flop 45. If either the chip enable signal CE# or the write enable signal WE# is at a high level, the burst write mode signal BWM is reset to a low level.

Here, the logic circuit 41 that makes a decision on a plurality of external control signals to generate the set signal is arranged before the clock-controlled set terminal-equipped D-type flip flop 45. As a result, the setting information for the burst write mode signal BWM is generated at a high speed. In addition, the hold function for the state of the set signal can be set at high speed. This is due to the fact that the signal BMW latched in response to the clock signal CLK is fed-back to the functional circuit 45 itself. In addition, the logic circuit 42 that makes a decision on a plurality of external control signals for generating the reset signal is arranged before the clock-controlled D-type flip flop 46. As a result, the reset information for the burst write mode signal BWM is output at a high speed.

The present invention is not limited to the above-described embodiments, and various improvements and modifications thereof are applicable without departing from the spirit and scope of the present invention. For instance, while the above-described embodiments describe an example in which the enter command and the exit command are buffered in synchronization with the clock signal, other commands can be buffered in synchronization with the clock signal.

Although a description was given of the D-type flip flop as having a circuit configuration for buffering the control signal in synchronization with the clock signal, the present invention is not limited to this. Any circuit configuration which can buffer signals in synchronization with the clock signal may be employed. Also, although a description was given of the synchronizing timing as the timing at which the clock signal transits to a high level, it is needless to say the timing of transition to a low level may also be employed.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A synchronous memory device for controlling a burst write operation, comprising:
   a first buffer circuit for buffering a first control signal requesting an exit from the burst write operation in synchronization with a clock signal associated with the burst write operation;
   a second buffer circuit for buffering a second control signal requesting an entry to the burst write operation in synchronization with the clock signal; and
   a latch circuit coupled to the first buffer circuit for performing a reset in response to the first control signal forwarded by the first buffer circuit, wherein the reset triggers the exit from the burst write operation.

2. The synchronous memory device according to claim 1, wherein the latch circuit is set for triggering the entry to the burst write operation in response to the second control signal when the first control signal is not active.

3. The synchronous memory device according to claim 2, further comprising an inverter coupled between a complemented output terminal of the latch circuit and a reset terminal of the second buffer circuit.

4. The synchronous memory device according to claim 3, wherein a control signal through the inverter prevents the second buffer circuit from the buffering the second control signal during the burst write operation.

5. The synchronous memory device according to claim 4, further comprising a first inverter coupled to an input terminal of the first buffer circuit and a second inverter coupled to an input terminal of the second buffer circuit.

6. The synchronous memory device according to claim 5, further comprising an AND gate coupled to a set terminal of the latch circuit for performing an AND operation of a first output signal of the first buffer circuit and a second output signal of the second buffer circuit.

7. A synchronous memory device for controlling a burst write operation, comprising:
   a first flip flop circuit for buffering an enter command for the burst write operation in synchronization with a clock signal associated with the burst operation;
   a second flip flop circuit for buffering an exit command for the burst write operation in synchronization with the clock signal;
   a reset decoder for decoding the exit command forwarded by the second flip flop circuit;
   a set decoder for decoding the enter command forwarded by the first flip flop Circuit; and
   a latch circuit for performing a reset in response to the exit command forwarded by the reset decoder.

8. The synchronous memory device according to claim 7 wherein the set decoder is coupled to a set terminal of the latch circuit.

9. The synchronous memory device according to claim 8, wherein the reset decoder is coupled to a reset terminal of the latch circuit.

10. A synchronous memory device for controlling a burst write operation, comprising:
    a first logic circuit and a second logic circuit for generating a set trigger signal and a reset trigger signal, respectively, by performing a logical operation between a chip enable signal and a write enable signal associated with the burst write operation;
    a first flip flop circuit for buffering the reset trigger signal of the second logic circuit in synchronization with a clock signal associated with the burst write operation; and
    a second flip flop circuit for buffering the set trigger signal of the first logic circuit in synchronization with the clock signal, wherein the set trigger signal of the first logic circuit is input to a set terminal of the second flip flop circuit.

11. The synchronous memory device according to claim 10, wherein the reset trigger signal of the second logic circuit is input to a reset terminal of the second flip flop circuit.

12. The synchronous memory device according to claim 10, wherein the first logic circuit comprises an NOR gate.

13. The synchronous memory device according to claim 10, wherein the second logic circuit comprises an OR gate.

14. The synchronous memory device according to claim 10, further comprising a delay element coupled between the first logic circuit and an input terminal of the second flip flop circuit.

15. The synchronous memory device according to claim 10, further comprising a delay element coupled between the clock and a clock terminal of the second flip flop circuit.

16. A method for controlling a burst write operation in a synchronous memory device, comprising:
   latching a state for performing the burst write operation;
   buffering a first control signal for requesting exit from the burst write operation in synchronization with a clock signal associated with the burst write operation;
   buffering a second control signal for requesting an entry to the burst write operation in synchronization with the clock signal; and
   resetting the state for the performing the burst write operation in response to the buffering of the first control signal.

17. The method according to claim 16, wherein the first control signal is associated with a chip disable signal.

* * * * *